(12) United States Patent
Katsuno et al.

(10) Patent No.: US 7,777,260 B2
(45) Date of Patent: Aug. 17, 2010

(54) SOLID-STATE IMAGING DEVICE

(75) Inventors: Motonari Katsuno, Kyoto (JP); Ryohei Miyagawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/166,736

(22) Filed: Jul. 2, 2008

(65) Prior Publication Data

US 2009/0008687 A1    Jan. 8, 2009

(30) Foreign Application Priority Data

Jul. 4, 2007    (JP) .............................. 2007-176661

(51) Int. Cl.
*H01L 33/00* (2010.01)
*H01L 21/00* (2006.01)

(52) U.S. Cl. ......................... 257/292; 257/432; 257/433; 257/434; 257/435; 257/436; 257/437; 257/E21.001; 257/E33.001; 438/69; 250/208.1

(58) Field of Classification Search ................. 257/292, 257/E21.001, E33.001, 432–437; 438/96; 250/208.1

See application file for complete search history.

(56) References Cited

U.S. PATENT DOCUMENTS 5,371,397 A    12/1994    Maegawa et al.

2005/0029433 A1 *    2/2005    Sakoh et al. ............. 250/208.1
2005/0045975 A1 *    3/2005    Kondo et al. ................. 257/414
2006/0038209 A1 *    2/2006    Hashimoto .................. 257/294
2006/0278948 A1    12/2006    Yamaguchi et al.

FOREIGN PATENT DOCUMENTS

| JP | 2-309674 | 12/1990 |
|----|----------|---------|
| JP | 2000-124434 | 4/2000 |
| JP | 2007-184322 A * | 7/2007 |

* cited by examiner

*Primary Examiner*—Lynne A Gurley
*Assistant Examiner*—Naima J Kearney
(74) *Attorney, Agent, or Firm*—McDermott Will & Emery LLP

(57) ABSTRACT

A solid-state imaging device includes: an imaging area in which light receiving portions are disposed; an interconnect layer disposed on the light receiving portions, the interconnect layer including metal interconnects having openings and first insulating films; inner-layer lenses formed over the interconnect layer in one-to-one relationship with the light receiving portions; a transparent second insulating film formed on the interconnect layer and the inner-layer lenses; top lenses formed on the second insulating film in one-to-one relationship with the light receiving portions, an upper face of each of the top lenses being a convexly curved face; and a transparent film on the top lenses, the transparent film being formed of a material having a refractive index smaller than a refractive index of the top lenses. In this way, a focal point of at least part of incident light can be situated above a semiconductor substrate.

10 Claims, 17 Drawing Sheets metal interconnect of
second layer 22B metal interconnect of
first layer 22A metal interconnect of
third layer 22C center pixel peripheral pixel

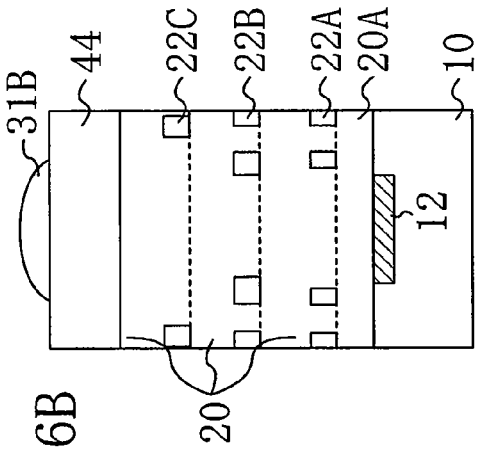
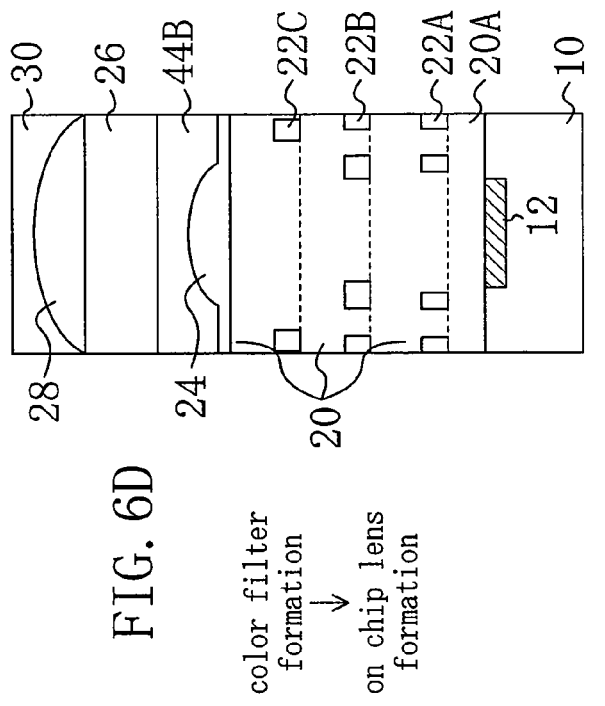
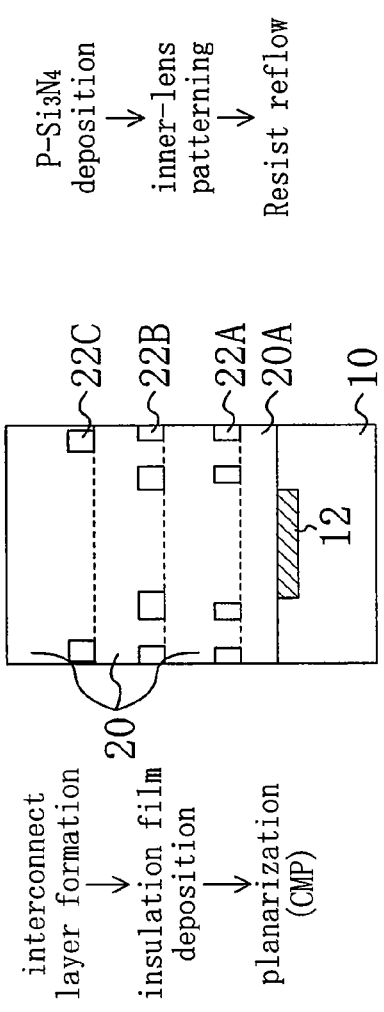
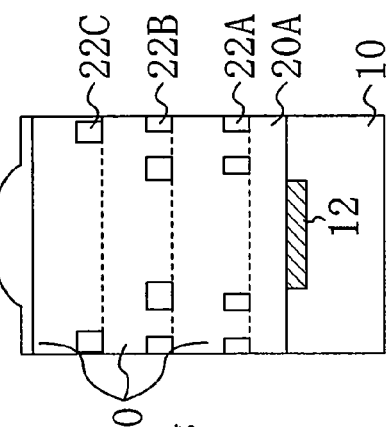

the case where a glass substrate and a solid-state imaging device are sealed with an adhesive material the case where a glass substrate and a solid-state imaging device are not sealed with an adhesive material

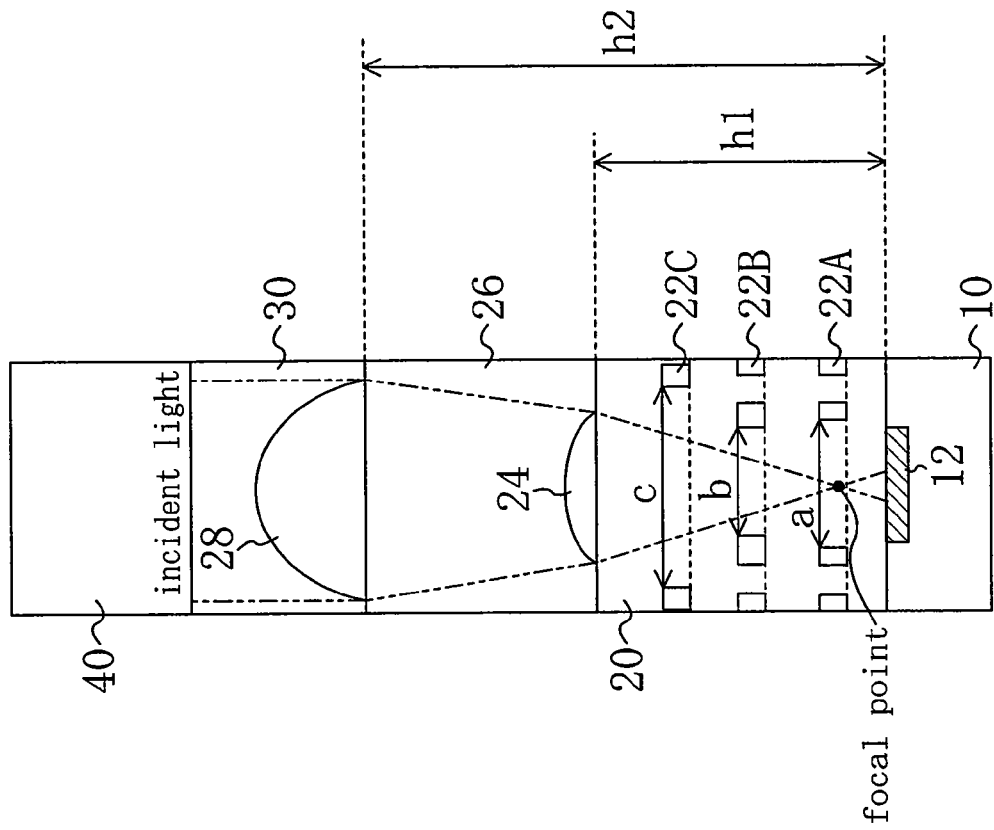
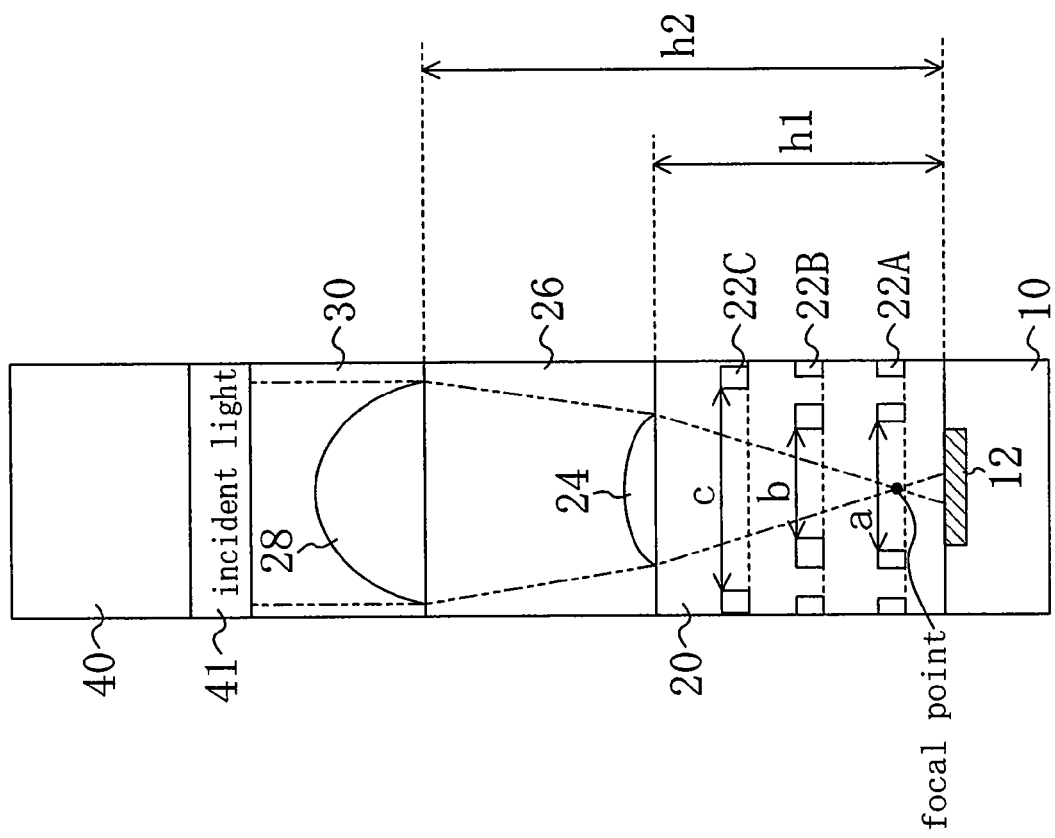

horizontal direction to pixel diagonal direction to pixel metal interconnect of first layer 22A metal interconnect of second layer 22B metal interconnect of third layer 22C

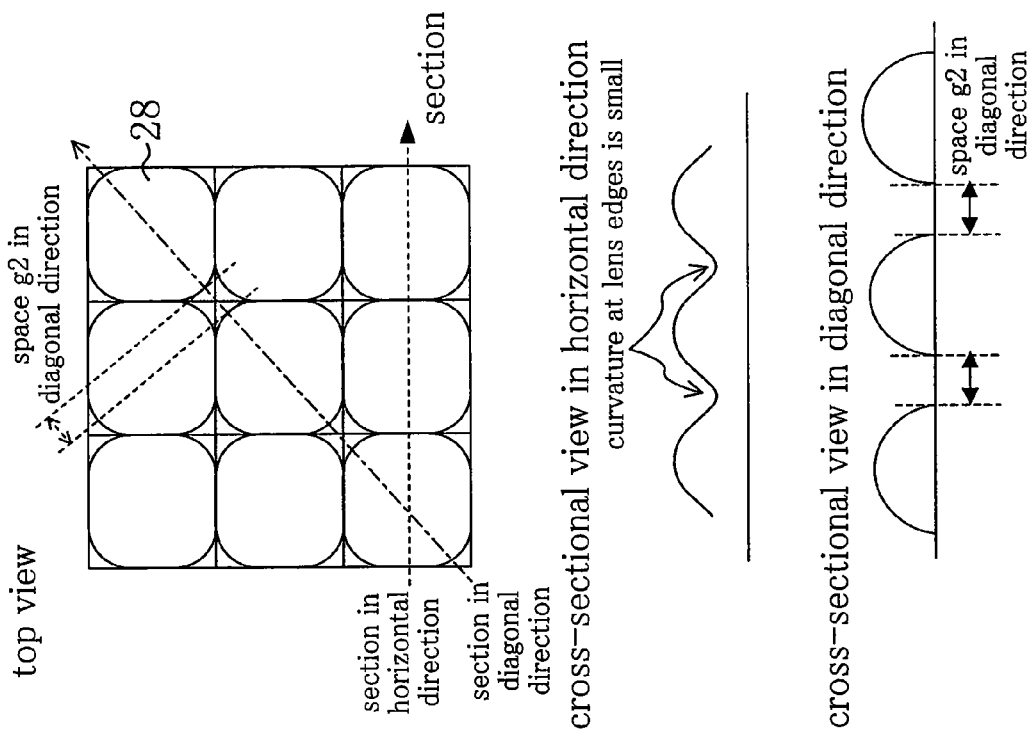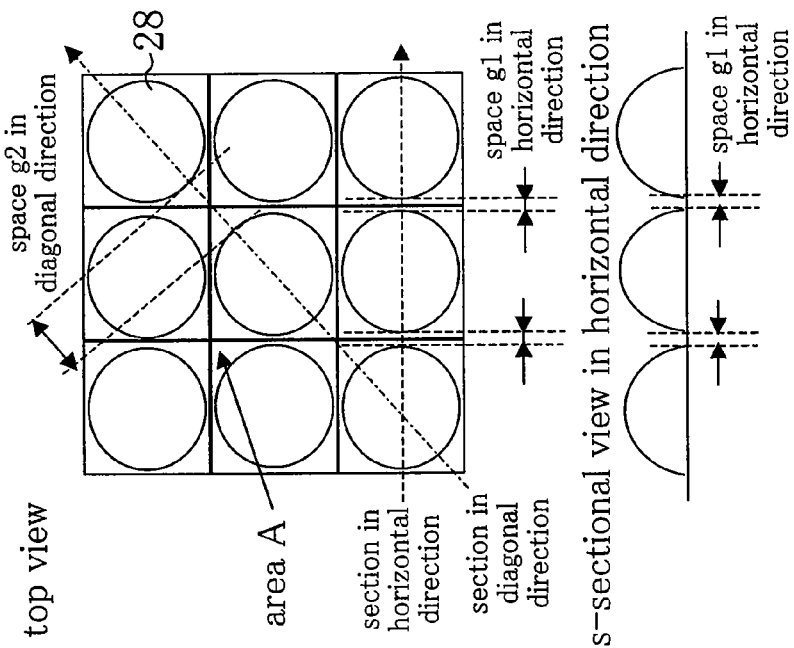

horizontal direction to pixel diagonal direction to pixel

FIG. 17A
the case where the lens height is great (0.5 μm or more)
shape before heat flow
128a
shape after heat flow
128
lens height
FIG. 17B
the case where the lens height is small (less than 0.5 μm)
shape before heat flow
128a
shape after heat flow
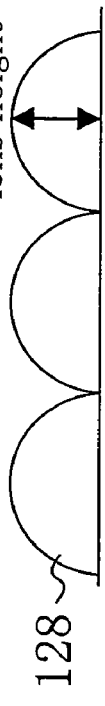
128
lens height

SOLID-STATE IMAGING DEVICE

BACKGROUND OF THE INVENTION

1. Field of the Invention

The present invention relates to a solid-state imaging device including lenses provided above a semiconductor substrate on which light receiving portions such as photoelectric conversion portions are formed, the lenses guiding incident light to the light receiving portions.

2. Description of the Prior Art

Generally, a solid-state imaging device such as a MOS image sensor is structured such that over a semiconductor substrate having a light receiving portion (a photoelectric conversion portion such as a photodiode), a variety of films such as a light-shielding pattern and an interconnect pattern is disposed in multi-layered manner. When such a solid-state imaging device is downsized, the exit pupil distance of a camera lens necessarily shortens. This increases an oblique component of light entering a pixel array portion (imaging area), especially the periphery of the pixel array portion, wherein in the pixel array portion, a plurality of pixels are two-dimensionally arranged. Therefore, when it comes to each pixel, as the incident angle of light increases, a component of the light blocked by interconnects or the like is large and the quantity of light directly entering a light receiving surface decreases. Therefore, it becomes difficult to keep image quality at a high level.

Japanese Published Unexamined Patent Application No. 2000-124434 discloses a conventional technique in which a light collection lens (inner-layer lens) is formed in an upper level film of an image sensor to improve the light receiving sensitivity, wherein the light collection lens is formed by a high refractive index material such as a P—SiN film (a silicon nitride film formed by plasma CVD), and an upper face of the light collection lens is formed as a convex lens face.

Moreover, Japanese Published Unexamined Patent Application No. H02-309674 discloses a solid-state imaging device as shown in FIG. 16 including: a light receiving element 112 provided on a surface portion of a substrate 111; and a light collection lens 116 disposed above the substrate 111, wherein a focal point of the light collection lens 116 is situated below an upper face of the substrate 111 to improve the sensitivity.

SUMMARY OF THE INVENTION

However, the solid-state imaging device according to the conventional technique has problems as follows.

First, unlike a CCD image sensor, a MOS image sensor generally includes a plurality of layers of metal interconnects formed over a photoelectric conversion portion for converting incident light into an electric charge. Therefore, if a focal point is situated below an upper face of a substrate, the incident light is easily scattered or reflected by the interconnects, which lowers the sensitivity as compared to the case where the focal point is adjusted to be on the upper face of the substrate. That is, if a focal position is situated below the upper face of the substrate 111, the amount of light reflected by the metal interconnects increases, and thus the light collection efficiency to a photodiode lowers.

Moreover, in the solid-state imaging device, top lenses (lenses disposed on an upper level) are generally formed by an organic material. A method for forming the top lenses is generally such that, as shown in FIG. 17A, rectangular (quadrilateral) patterns 128a are first formed, and then a heat treatment is performed to form curved lenses 128 (hereinafter referred to as a heat reflow process).

However, in the heat reflow process for forming the lenses 128, if the height (thickness) of the rectangular patterns is smaller (thinner) than a certain height (thickness), an upper face of a center portion of each lens 128 is flat as shown in FIG. 17B, and thus it is difficult to obtain a lens curved face having a smooth and uniform shape after heat flow. Therefore, in the conventional solid-state imaging device, the shape of the top lens may not be formed as it is designed.

Therefore, an object of the present invention is to provide a solid-state imaging device in which a deterioration of a sensitivity characteristic with respect to a diaphragm (F value) characteristic of an imaging device (camera) is small, with the sensitivity characteristic being improved.

A solid-state imaging device of the present invention includes: an imaging area including a plurality of light receiving portions formed on a semiconductor substrate; a multi-layered interconnect layer disposed on the plurality of light receiving portions, the multi-layered interconnect layer including metal interconnects and insulating films; first lenses formed on the multi-layered interconnect layer in one-to-one relationship with the light receiving portions; second lenses formed above the first lenses; and a transparent film formed on the second lenses, wherein a refractive index of the transparent film is smaller than a refractive index of the second lenses, and a thickness of the second lenses is greater than a thickness of the first lenses.

With this configuration, the effective refractive index of each second lens can be lower as compared to the case where the transparent film is not provided. Therefore, a focal position of light passing through the second lens can be optimized easily. For example, even in the case where the second lens is formed by an organic material such as a photoresist, a focal position of incident light can be situated above the semiconductor substrate while the second lens has a great thickness.

A method for fabricating a solid-state imaging device of the present invention includes the steps of: (a) forming light receiving portions in upper portions of a semiconductor substrate, (b) forming a one-layered interconnect layer including a metal interconnect having openings in areas above the light receiving portions and a first insulating film embedding the metal interconnect, or a multi-layered interconnect layer including metal interconnects having openings in areas above the light receiving portions and first insulating films embedding the metal interconnects; (c) forming first lenses over the interconnect layer in one-to-one relationship with the light receiving portions; (d) forming a transparent second insulating film on the interconnect layer and the first lenses; (e) forming second lenses on the second insulating film in one-to-one relationship with the light receiving portions, an upper face of each of the second lenses being a convexly curved face; and (f) on the second lenses, forming a transparent film of a material having a refractive index smaller than a refractive index of the second lenses.

With this method, it is possible to form a solid-state imaging device having a high light receiving efficiency.

Specifically, the second lenses are preferably formed of an organic material such as a photoresist, because in this case, an upward or downward convexly curved face can be formed easily. In this case, the patterns formed of the organic material are heated, so that the second lenses can be formed. Here, the patterns may have a sufficiently great thickness, and at the same time, a focal point of light passing through each second lens and each first lens can be situated above the upper face of the semiconductor substrate.

BRIEF DESCRIPTION OF THE DRAWINGS

FIGS. 6A through 6D are cross-sectional views illustrating steps for fabricating a solid-state imaging device according to Embodiment 1.

FIGS. 8A and 8B are cross-sectional views each showing an example of the MOS image sensor according to Embodiment 1.

FIG. 12A schematically shows top lenses in a plan view and a cross-sectional view, wherein the top lenses are spaced apart from each other in any direction in a MOS image sensor, and FIG. 12B schematically shows top lenses in a plan view and in a cross-sectional view, wherein the top lenses adjacent to each other at least in the horizontal direction are in connection with each other.

FIGS. 17A and 17B are views showing top lenses having a great height and top lenses having a small height in a state before heat flow and in a state after the heat flow.

DESCRIPTION OF THE PREFERRED EMBODIMENTS

With reference to the drawings, an amplified solid-state imaging device (MOS image sensor; CMOS image sensor), which is a solid-state imaging device according to embodiments of the present invention, will be described below.

Embodiment 1

Configuration of MOS Image Sensor and Operation/Effect Thereof

Figure 1:
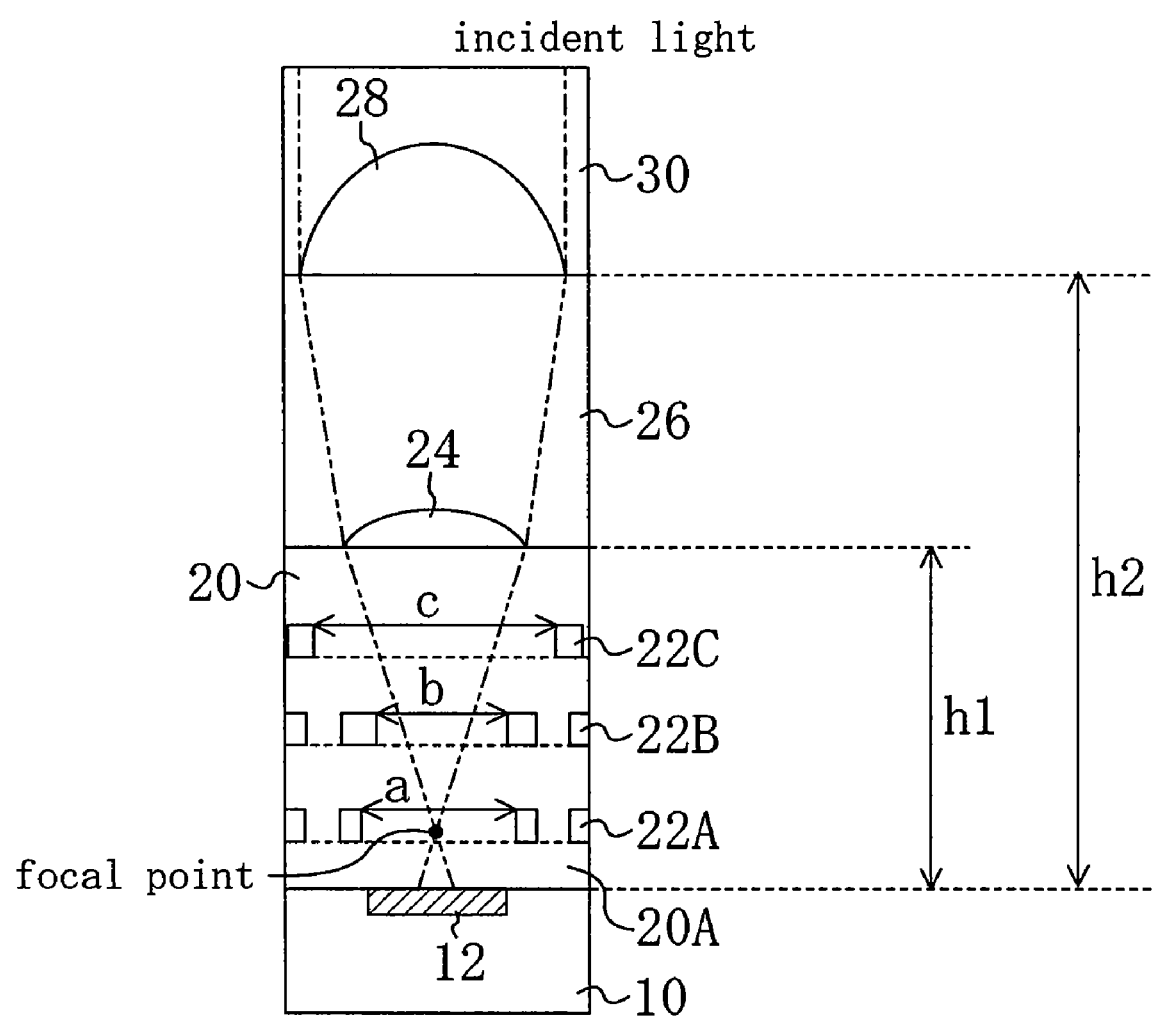
FIG. 1 is a cross-sectional view showing a structure in a pixel of a MOS image sensor according to Embodiment 1 of the present invention.

FIG. 1 is a cross-sectional view showing a structure in a pixel of a MOS image sensor according to Embodiment 1.

As shown in the figure, the MOS image sensor of the present embodiment includes: a light receiving portion 12 such as a photodiode (PD) provided on a semiconductor substrate 10, the light receiving portion 12 performing photoelectric conversion upon receiving incident light; a transfer gate (TG; not shown) provided on the semiconductor substrate 10, the transfer gate reading out a signal electric charge generated in the light receiving portion 12; and an imaging area provided on the semiconductor substrate 10, a number of pixels being disposed in the imaging area, and each pixel having a floating diffusion (FD) or the like for temporarily storing the signal electric charge read out of the light receiving portion 12 by the transfer gate. Here, the transfer gate is configured by a transistor.

Moreover, on the semiconductor substrate 10, an insulating film 20A is formed. Over the insulating film 20A, an insulating film 20 including, for example, a plurality of insulating films is provided. Over the insulating films 20, interconnects 22A, 22B, and 22C made of a metal material such as aluminum or copper are respectively provided. The interconnect 22A of a first layer, the interconnect 22B of a second layer, and the interconnect 22C of a third layer are disposed to have predetermined spaces a, b, and c respectively in the lengthwise direction and the lateral direction over the light receiving portion 12 so that the interconnects 22A, 22B, and 22C may not pass over the light receiving portion 12 as far as possible. That is, the solid-state imaging device according to the embodiments of the present invention is an amplified solid-state imaging device (MOS image sensor; CMOS image sensor) including a multi-layered interconnect formed in a pixel.

Moreover, on a topmost insulating film 20 which is provided on the interconnect 22C, an inner-layer lens (first lens) 24 is provided. Moreover, over the inner-layer lens 24 and the topmost insulating film 20, an insulating film 26 including a color filter is formed. On the insulating film 26, a top lens (second lens) 28 is formed. On the top lens 28, a transparent film 30 is provided.

The inner-layer lens 24 is formed on a flat face of the insulating film 20 and formed by a silicon nitride film ($Si_3N_4$) or the like which is a high refractive index material. An upper face of the inner-layer lens 24 has a convex shape, and on the inner-layer lens 24, an insulation planarization film (not shown) formed by a silicon oxide film or the like is provided. The insulating film 26 including the color filter is provided on the planarization film.

The top lens 28 is formed by an organic material such as transparent polymer resin and has a convex upper face. Here, one of characteristics of the solid-state imaging device according to the present embodiment is that on the top lens 28, the transparent film (insulating film) 30 whose refractive index is lower than that of the top lens 28 is provided to effectively lower the refractive index of the top lens 28. As specifically described later, even when the top lens 28 has a center thickness of greater than or equal to, for example, 0.5 µm, this configuration allows the effective refractive index of the top lens 28 to be substantially the same as that in the case where the top lens 28 has a center thickness of less than 0.5 µm.

Moreover, in the MOS image sensor according to the present embodiment, a focal position of light collected by the top lens 28 and the inner-layer lens 24 is situated above an upper face of the semiconductor substrate 10. Here, in the specification of the present application, a term mentioned simply by "focal position" means a focal position in the case where parallel light enters the top lens 28. It is to be noted that a focal position of diffused light may be situated above the upper face of the semiconductor substrate 10, but it is preferable that the focal position of the diffused light is situated on or below the upper face, since in this case, it is possible to suppress the leakage of the light passing through the semiconductor substrate 10 into a light receiving portion 12 of an adjacent pixel.

Here, when an opening width a of the interconnect 22A above the light receiving portion 12, an opening width b of the interconnect 22B above the light receiving portion 12, and an opening width c of the interconnect 22C above the light receiving portion 12 are compared with one another, the following relation is obtained: $b<a<c$.

Therefore, in the MOS image sensor according to the present embodiment, a focal position of incident light is situated above the upper face of the semiconductor substrate 10. In this way, it is possible to reduce divergence of the incident light between a first interconnect layer provided with the interconnect 22A and a second interconnect layer provided with the interconnect 22B. Therefore, a decrease of light collection efficiency due to reflection or scattering of light by the interconnects can be suppressed to improve the light collection efficiency.

It is to be noted that the focal position of the incident light is preferably between the first interconnect layer and the second interconnect layer, in other words, in a height range from a lower face of the interconnect 22A to an upper face of the interconnect 22B both inclusive. However, when viewed in plane, it is necessary for the focal position of the incident light to be within the openings above the light receiving portion 12.

The divergence of light is the smallest at a focal position. Accordingly, in the vicinity above and below the focal position, the divergence of the light becomes small. Therefore, if a focal position is set in the vicinity of an opening of an interconnect having the smallest opening width, the light collection efficiency to the light receiving portion 12 can be maximized.

It is to be noted that generally, when the opening width a of the interconnect 22A of the first layer above the light receiving portion 12, the opening width b of the interconnect 22B of the second layer above the light receiving portion 12, and the opening width c of third layer interconnect 22C of the third layer above the light receiving portion 12 are compared with one another, the following relation is obtained: $b<a<c$. Therefore, a reduction of the light collection efficiency due to reflection or scattering of light by the interconnect layers can be suppressed more in the case where the divergence is reduced in the vicinity of the interconnect 22A of the first layer than in the case where the divergence is reduced in the vicinity of the interconnect 22C of the third layer.

It is to be noted that in the MOS image sensor of the present embodiment, longitudinal sections through the center of the top lens 28 have substantially the same shape in any direction, for example, in the horizontal direction (the left and light direction of FIG. 1), the vertical direction (the direction from front to back of FIG. 1), the diagonal direction, or the like. That is, the curvatures of the upper face of the top lens 28 are the same in any direction.

Figure 2:
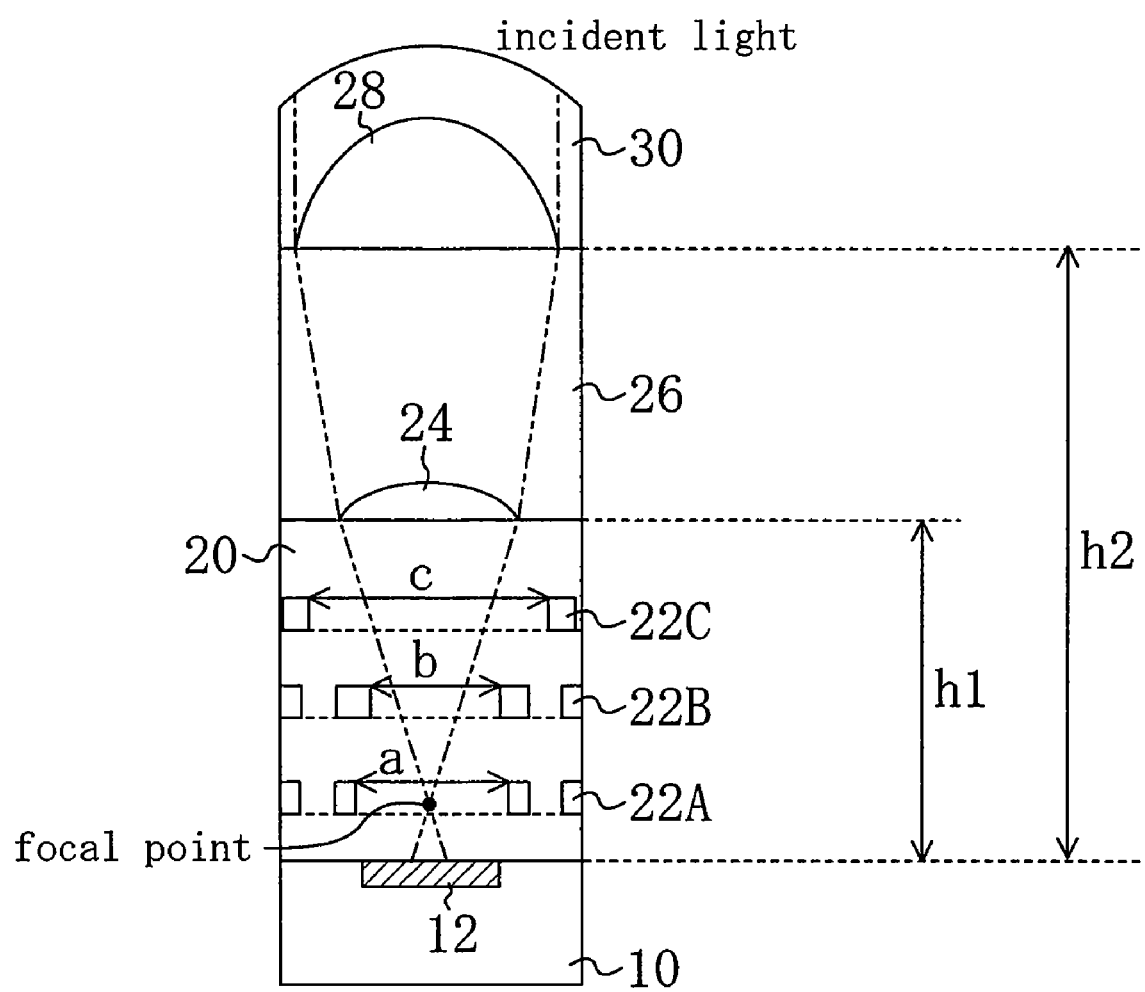
FIG. 2 is a cross-sectional view showing a variation of the MOS image sensor according to Embodiment 1.

Although in the MOS image sensor of FIG. 1, an upper face of the transparent film 30 provided on the top lens 28 is flat, the upper face of the transparent film 30 may have an upward convexly curved face shape as shown in FIG. 2. In this case, the transparent film 30 can be provided with a function as a lens.

Figure 3B:
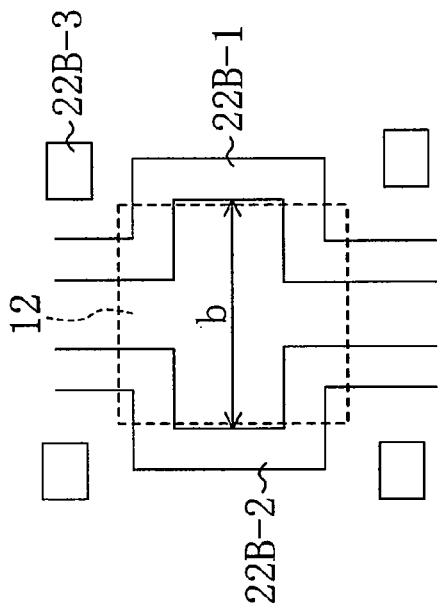
FIGS. 3A through 3C are plan views showing interconnect patterns of respective layers in the pixel of the MOS image sensor according to Embodiment 1.
Figure 3A:
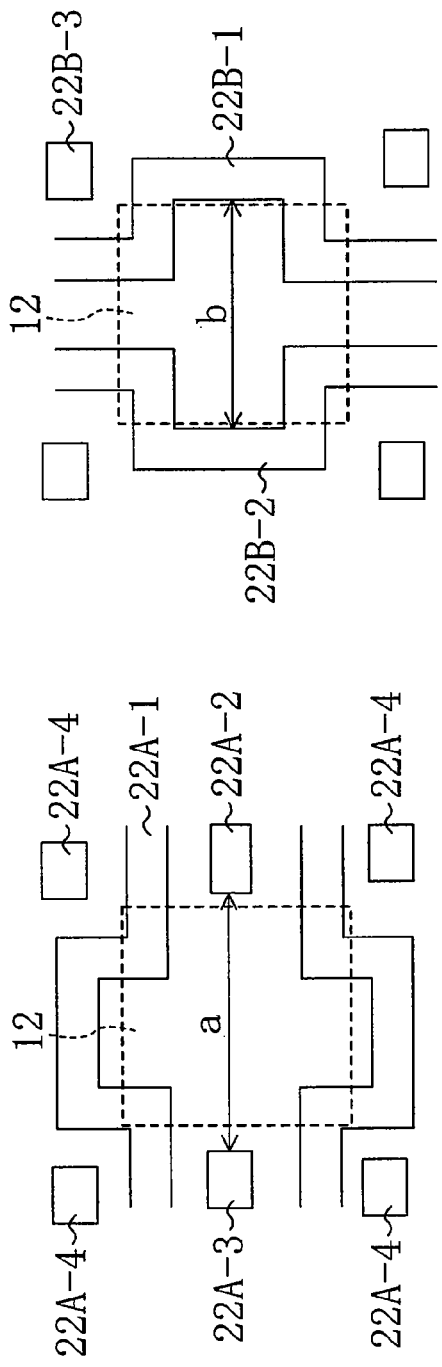
Figure 3C:
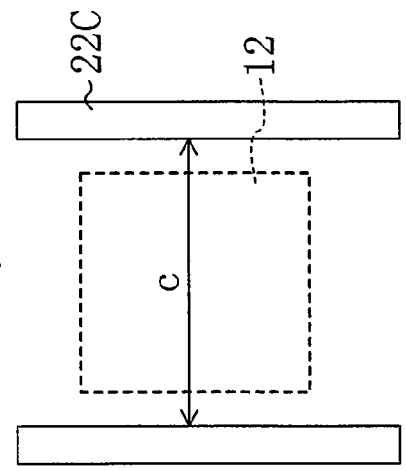

Next, FIGS. 3A through 3C are plan views showing interconnect patterns of respective layers in the pixel of the MOS image sensor of the present embodiment.

As shown in FIG. 3A, the interconnect 22A of the first layer includes, for example, interconnects 22A-1 which pass over part of the light receiving portion 12 in the horizontal direction (in the lateral direction of FIG. 3A), and locally formed interconnects 22A-2, 22A-3, and 22A-4. The interconnects 22A-1 are interconnects for supplying the transfer gate with a power source voltage and are connected via contacts (not shown) to the transfer gate.

Moreover, the interconnect 22A-2 is an interconnect for reading out an electric potential of the FD on the semiconductor substrate 10 and is connected via a contact to an interconnect 22B-1 of the second layer. The interconnect 22A-3 is an interconnect for supplying an amplifying transistor and a reset transistor on the semiconductor substrate 10 with the power source voltage and is connected via a contact to an interconnect 22B-2 of the second layer.

Moreover, as shown in FIG. 3B, the interconnect of the second layer includes the interconnects 22B-1 and 22B-2 which pass over part of the light receiving portion 12 in the vertical direction (the lengthwise direction of FIG. 3B), and locally formed interconnects 22B-3. The interconnect 22B-1 is an interconnect for reading out the electric potential of the FD. The interconnect 22B-2 serves to supply the amplifying transistor and the reset transistor on the semiconductor substrate 10 with the power source voltage.

Furthermore, the interconnect 22C of the third layer and the interconnects 22A-4 are electrically connected via the interconnects 22B-3 and contacts and serve to apply the electric potential of the FD to a gate electrode of the amplifying transistor.

As described above, in the MOS image sensor according to the present embodiment, the interconnect 22C of the third layer includes a small number of interconnects and its opening width c is much greater than the opening width a of the first layer and the opening width b of the second layer. Moreover, when the opening width a of the first layer is compared with the opening width b of the second layer, the opening width b of the second layer is generally smaller than the opening width a of the first layer.

The opening width a is greater than the opening width b because every time an interconnect is formed, an insulating film embeds the interconnect for planarization in a general semiconductor fabrication process, and thus the insulating films closer to the upper level have a greater surface variation after the planarization, which makes miniaturization of interconnects difficult. That is, the smallest interconnect width of the first layer is smaller than that of the second layer, and thus the opening width a of the first layer can be greater than the opening width b of the second layer. If the pixel size is, for example, 1.75 μm on a side, a is on the order of 1.2 μm, b is on the order of 0.9 μm, and c is on the order of 1.5 μm.

That is, to ensure the quantity of incident light to the light receiving portion 12, it is important to control shapes of the inner-layer lens 24 and the top lens 28 such that light is not reflected or scattered by the interconnect 22A of the first layer and the interconnect 22B of the second layer. In this case, it is important for a lens shape that the lens curvature is designed such that the focal position of the light collected by the top lens 28 and the inner-layer lens 24 is situated above the semiconductor substrate 10. In particular, it is necessary for a focal point of light to be situated between the first interconnect layer and the second interconnect layer so that the divergence of incident light can be small between the first interconnect layer and the second interconnect layer.

Moreover, the MOS image sensor includes in its imaging area the multi-layered interconnect layer including interconnect layers and interlayer insulating films which a CCD (Charge Coupled Device) image sensor does not have. Therefore, a distance h1 between the upper face of the semiconductor substrate 10 and the inner-layer lens 24 and a distance h2 between the upper face of the semiconductor substrate 10 and the top lens 28 are much greater than those of the CCD image sensor. For example, the MOS image sensor of the present embodiment has a distance h1 of the order of 3.5 μm and a distance h2 of the order of 4.5 μm. In contrast, the CCD image sensor has a distance h1 of the order of 2.5 μm and a distance h2 of the order of 3.5 μm. Therefore, the MOS image sensor according to the present embodiment has smaller curvatures of the top lens 28 and the inner-layer lens 24 than those of the CCD image sensor.

The reason for this is that if a lens surface has a great curvature, a light collection position is situated far above a substrate upper face, so that the divergence of incident light is great on the substrate upper face. As a result, it is not possible to collect sufficient light to the light receiving portion 12.

It is to be noted that generally, in the CCD image sensor, if the cell size is 1.75 μm (on a side), the inner-layer lens has a center thickness of the order of 0.7 μm, and the top lens has a center thickness of the order of 0.5 μm. Here, in the CCD image sensor, above the top lens, the insulating film or the like is not formed, but air (refractive index=1) exists.

If these lens thicknesses are applied to the MOS image sensor just as they are, a focal position is situated far above the substrate upper face, and thus sufficient light collection efficiency can not be obtained. Therefore, in the MOS image sensor, it is necessary for the inner-layer lens to have a center thickness of the order of 0.3 μm, and for the top lens to have a center thickness of the order of 0.2 μm. However, because of the reason described below, it is difficult to provide a top lens having such a thin center thickness with a shape as it is designed.

The top lens 28 is generally formed by heat flow whose specific process includes: forming a photoresist which is to be the top lens; patterning the photoresist to form a mask portion having a shape corresponding to the light receiving portion 12; and causing the photoresist to reflow at a predetermined temperature to curve a surface of the mask portion convexly. Through this process, the top lens 28 having a convexly curved upper face as shown in FIG. 6D is formed.

However, in the case of a small lens thickness of the order of less than 0.5 μm, it is generally very difficult for this process (heat flow) to realize a smooth top lens with good uniformity. As FIG. 17A, in the case where the lens thickness is greater than a certain thickness (for example, the lens thickness is greater than or equal to 0.5 μm), melting the lens to make its lens shape blunt results in that the entirety of the upper face of the lens is curved (has a curvature). However, as FIG. 17B, in the case where the lens thickness is smaller than 0.5 μm, the lens is to have a curvature only in the vicinity of both ends thereof, but in the vicinity of the center of the lens, the lens does not have a curvature but has a linear structure.

However, in the MOS image sensor according to the present embodiment, on the top lens 28, the transparent film 30 whose refractive index is lower than that of the top lens 28 is formed by coating. In this way, the refractive index of the top lens 28 is effectively lowered. Therefore, a focal position of incident light can be situated between the first interconnect layer and the second interconnect layer, while the thickness of the top lens 28 is greater than or equal to a predetermined value.

For example, in the case where the photoresist used for forming the top lens 28 has a refractive index of 1.5, if the refractive index of the transparent film 30 is on the order of 1.2, the center thickness of the top lens may be greater than or equal to 0.7 μm and smaller than or equal to 1.0 μm, and it is possible to form a smooth lens shape with good uniformity. It is to be noted that in the case where a glass substrate (transparent component) is adhered to an upper face of the image sensor by an adhesive material, it is preferable that the refractive index of the transparent film 30 is greater than or equal to 1.4 and smaller than 1.5 and the refractive indices of the adhesive material and the glass substrate are substantially the same as the refractive index of the transparent film 30 to reduce reflection of incident light.

As described above, in the MOS image sensor according to the present embodiment, the center thickness of the top lens 28 is greater than that of the inner-layer lens 24, and the transparent film 30 is applied on the top lens 28, wherein the refractive index of the transparent film 30 is lower than that of the top lens 28. In this way, the focal position can be situated between the first interconnect layer and the second interconnect layer. Moreover, it is possible to prevent a shape variation of the top lens 28, so that a MOS image sensor can be obtained which has a high sensitivity characteristic and in which a sensitivity variation is suppressed.

That is, the present invention is characterized by being applied not to the CCD image sensor but to the MOS image sensor (amplified solid-state imaging device; CMOS image sensor), and thus an excellent image characteristic can be obtained.

It is to be noted that, as a material for the transparent film 30, a low refractive index film such as fluorinated resin can be used.

This is because fluorinated resin is less likely to be deteriorated by light as compared to the other resin (for example, acrylic resin) (the strength of film is high) and has an excellent heat resistance and also a very small dependence of the transmittance on the wavelength of light.

It is to be noted that, any other transparent material than fluorinated resin may be used to form the transparent film 30, as long as the refractive index of the transparent material is lower than that of the top lens 28. As an example, an oxide film such as an SOG (Spin on Glass) film may be used.

As described above, miniaturization of an image sensor has advanced in recent years, increasing the aspect ratio (the ratio D/S, where S is the opening area and D is the depth of the photodiode) of a pixel. This increases oblique component of light entering the above-mentioned imaging area, especially the periphery of the imaging area. Moreover, as descried above, since the MOS sensor includes the multi-layered interconnect formed over the gate electrode, the distance for light entering the sensor to reach the light receiving portion is generally greater than that in the CCD sensor.

Therefore, the design of the inner-layer lens and the top lens of the MOS sensor is more complex than that of the CCD device. That is, in the MOS sensor, it is necessary to study further optimization of a lens design as compared to the CCD device. Therefore, inventors of the present application carried out a study on the thicknesses of the inner-layer lens and the top lens. As a result, it was found that in a structure having no transparent layer on the top lens, in theory, when the top lens was thinner than the inner-layer lens, it was possible to increase the quantity of light entering the light receiving portion in most cases.

However, as described above, in the MOS image sensor having a general configuration, for example, as in the case where heat flow is used to fabricate the top lens, it was practically difficult to reduce the thickness of the top lens to be smaller than or equal to the predetermined value. In contrast, since the MOS image sensor of the present embodiment includes the transparent film 30 having a low refractive index formed on the top lens 28, it is possible to obtain an excellent optical characteristic as in the case where the thickness of the top lens 28 is less than the thickness of the inner-layer lens 24. Therefore, in the MOS image sensor of the present embodiment, the sensitivity is improved, and in addition to this, lowering of the sensitivity caused also by a change in F value (dependence on F value) of a camera lens can be suppressed to a minimum.

It is to be noted that as a material for forming the top lens 28, any other transparent organic material than the photoresist may be used. However, the photoresist is most preferably used because of reasons such as that the photoresist allows the formation of a convexly curved face at a relatively low temperature and the influence of the photoresist on an injection layer or the like of the MOS image sensor is negligible.

Moreover, a material for forming the inner-layer lens 24 is not limited to silicon nitride. Alternatively, other inorganic materials such as silicon oxynitride or silicon oxide, or an organic material such as fluororesin or acrylic resin may be used.

Next, with reference to FIGS. 4 and 5, descriptions will be given of a so-called shrink structure in the MOS image sensor according to the present embodiment.

Figure 4:
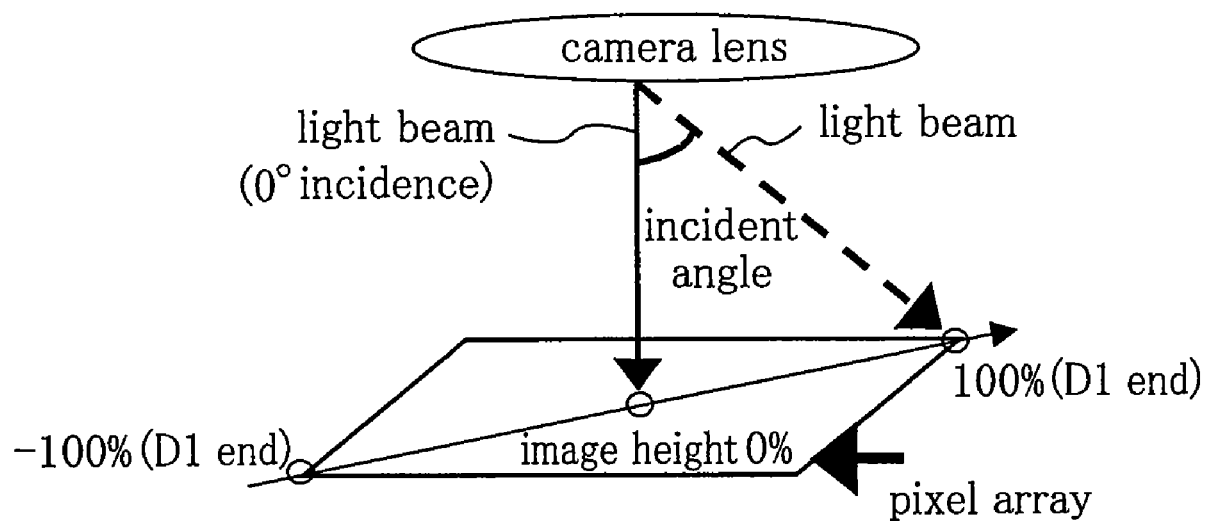
FIG. 4 is a view with reference to which descriptions are given of incident light in the case where the MOS image sensor according to Embodiment 1 is provided in an imaging device.
Figure 5A:
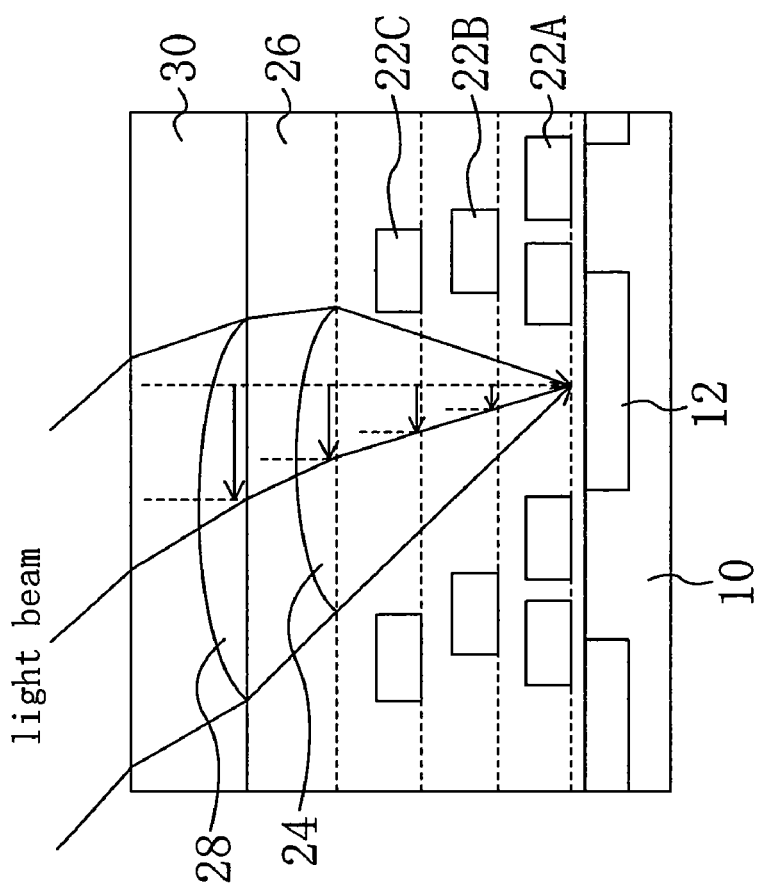
FIG. 5A is a view showing incident light in a pixel provided in the center of an imaging area of the MOS image sensor according to Embodiment 1.
Figure 5B:
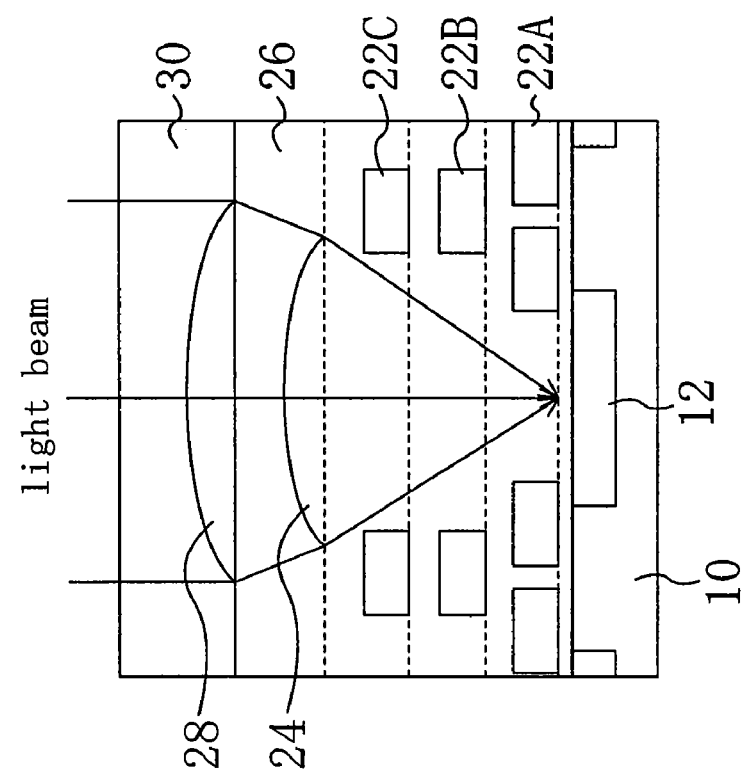
FIG. 5B is a view showing incident light in a pixel disposed in the periphery of the imaging area of the MOS image sensor according to Embodiment 1.

FIG. 4 is a view with reference to which descriptions are given of incident light in the case where the MOS image sensor of Embodiment 1 is provided in an imaging device. FIG. 5A is a view showing incident light in a pixel provided in the center of the imaging area in the MOS image sensor of Embodiment 1. FIG. 5B is a view showing incident light in a pixel disposed in the periphery of the imaging area in the MOS image sensor of Embodiment 1.

It is not mentioned in FIG. 1 and its description for easy understanding but is preferable that in the MOS image sensor of the present embodiment, as shown in FIG. 5B, in the pixel disposed in the periphery of the imaging area, positions of the top lens 28, the inner-layer lens 24, the interconnects 22A, 22B, and 22C on a basis of the position of the light receiving portion 12 are shifted toward the center or the periphery of the imaging area. The reason for this will be explained below.

As shown in FIG. 4, the pixel situated in the center of the imaging area mainly receives vertical (angle: 0°) light, but the pixel situated in the periphery of the imaging area mainly receives oblique light (angle: about 25°). That is, the proportion of the oblique component in light entering the MOS image sensor increases from the center to the periphery of the imaging area (pixel array). Therefore, in the pixel situated in the periphery of the imaging area, the positions of the top lens 28, the inner-layer lens 24, and the interconnects 22A, 22B, and 22C are accordingly shifted toward the center or the periphery of the imaging area, so that the oblique light is less likely to be blocked by the interconnects or the like. This can prevent a reduction in quantity of light reaching the light receiving portion 12 and increase the light collection efficiency. It is to be noted that not all of the top lens 28, the inner-layer lens 24, and the interconnects are necessarily shifted. Positions of any one or more of the members may be shifted if necessary.

Method for Fabricating MOS Image Sensor (Solid-State Imaging Device)

FIGS. 6A through 6D are cross-sectional views illustrating steps for fabricating the solid-state imaging device according to the present embodiment.

First, as illustrated with FIG. 6A, in an upper portion of a semiconductor substrate 10, a light receiving portion 12 such as a photodiode is formed by a known method, for example, by ion injection. Then, on the semiconductor substrate 10, an insulating film (interlayer insulating film) 20A including a plurality of layers or a single layer and an interconnect 22A made of Al or Cu are formed. Subsequently, high-density plasma CVD (HDP-CVD) or plasma CVD at a low temperature is performed to deposit an insulating film 20 which is formed by a tetraethoxysilane layer (P-TEOS) or the like. The insulating film 20 has a refractive index of about 1.45. Then, CMP is performed to planarize an upper face of the insulating film 20. The steps of forming the interconnect, and forming and planarizing the insulating film 20 are repeated to form a multi-layered interconnect in a pixel.

Then, as illustrated with FIG. 6B, on a topmost insulating film 20 of a multi-layered interconnect layer, a silicon nitride film 44A is formed by CVD. The silicon nitride film 44A has a refractive index of the order of 1.9 to 2.0. Subsequently, on the silicon nitride film 44A, a photoresist is formed. The photoresist is patterned to form a mask portion in a position corresponding to the light receiving portion 12. Then, the photoresist is caused to reflow at a predetermined temperature such that an upper face of the mask portion becomes a convexly curved face. Through these processes, a photoresist 31B having the convexly curved face is formed.

Then, as illustrated with FIG. 6C, together with the photoresist 31B having the convexly curved face, the silicon nitride film 44A is etched to transfer an upper face shape of the photoresist 31B to the silicon nitride film 44A, forming an inner-layer lens 24 whose base material is the silicon nitride film 44A. Here, the inner-layer lens 24 has a center thickness of the order of 350 nm, for example.

Then, as illustrated with FIG. 6D, on the inner-layer lens 24, an insulation planarization film 44B is formed. As a material of the planarization film 44B, for example, silicon oxide or the like having a refractive index of the order of 1.5 may be used, or acryl-based heat curing resin or the like having a refractive index of the order of 1.5 may be used. It is to be noted that at an interface between the convex upper face of the inner-layer lens 24 and the planarization film 44B, light is refracted due to the relative relation between the refractive indices of both the layers.

Moreover, over the planarization film 44B, a color filter 50, a top lens 28, and a transparent film 30 are sequentially formed. Specifically, a photoresist which is to be the top lens 28 is formed, and then the photoresist is patterned to form a mask portion in a position corresponding to the light receiving portion 12. Then, the mask portion is caused to reflow at a predetermined temperature such that an upper face of the mask portion becomes a convexly curved face, so that the top lens 28 is obtained. It is to be noted that the photoresist used as a material for the top lens 28 has a refractive index of the order of 1.6, for example. Subsequently, on the top lens 28, for example, a transparent film 30 is formed by spin coating or the like, the transparent film 30 being formed of a low refractive index material such as fluorinated resin (a material having a refractive index lower than the refractive index of the photoresist constituting the top lens 28). It is to be noted that the low refractive index material has a refractive index of, for example, 1.4. It is to be noted that if the transparent film 30 has a refractive index of the order of 1.4, the top lens 28 may have a thickness of greater than or equal to 0.5 μm and smaller than or equal to 1.0 μm, and it is possible to form a smooth lens shape with good uniformity. Alternatively, if the transparent film 30 has a refractive index of the order of 1.5, the top lens 28 may have a thickness of greater than or equal to 0.7 μm and smaller than or equal to 1.0 μm.

Figure 7A:
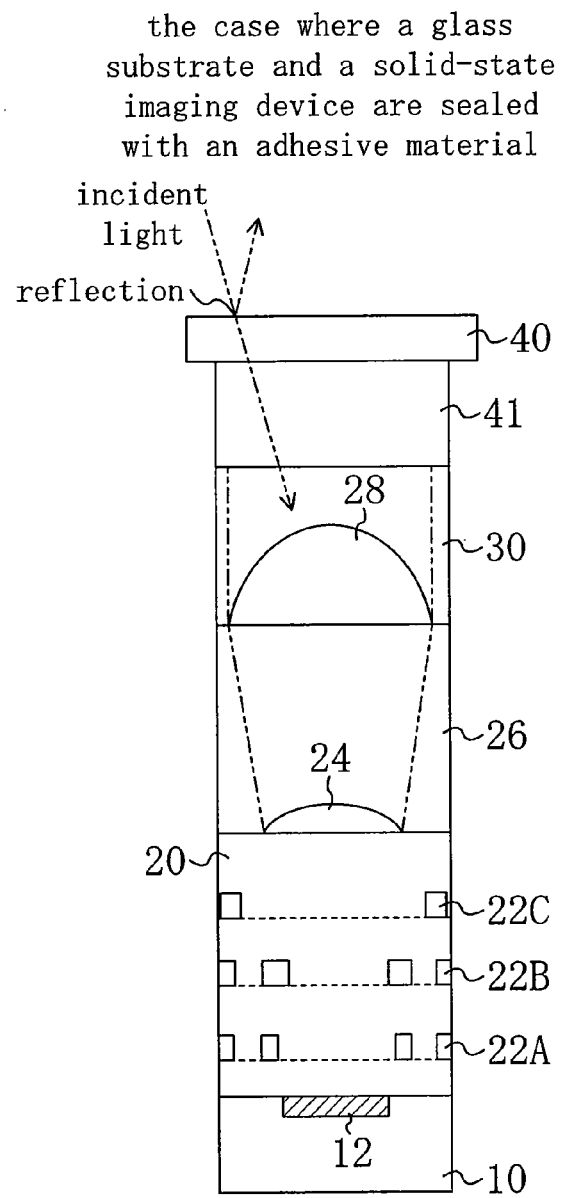
FIGS. 7A and 7B are cross-sectional views each showing the MOS image sensor according to Embodiment 1 in the case where a sealing glass substrate is provided.
Figure 7B:
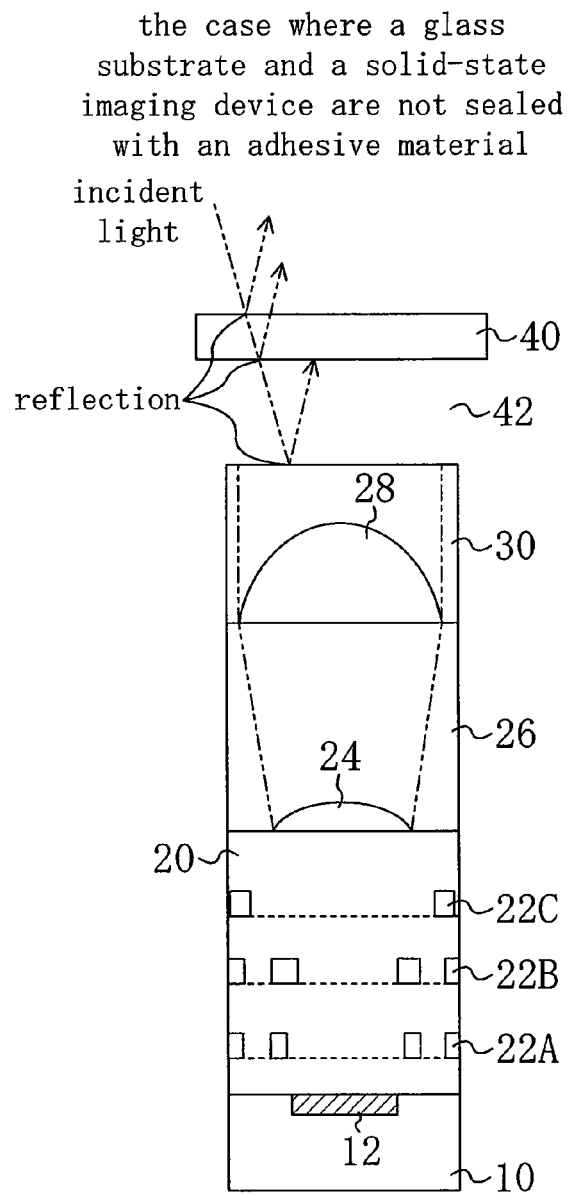

FIGS. 7A and 7B are cross-sectional views each showing the MOS image sensor of the present embodiment in the case where a sealing glass substrate (transparent component) is provided. As shown in FIG. 7B, on the transparent film 30, a substance 42 (for example, gas) having a refractive index much lower than that of the transparent film 30 may be disposed, or as shown in FIG. 7A, a transparent adhesive material 41 or the like for adhering a sealing glass substrate 40 may be disposed. However, as described later, using the adhesive material 41 is more preferable because in this case the light collection efficiency is much improved. It is to be noted that in the following description, "solid-state imaging element" expediently means the MOS image sensor (solid-state imaging device) excepting the glass substrate 40 and the substance 42 which is gas.

Usually, a solid-state imaging element such as an image sensor is sealed in a protection package, and in this case, a glass substrate is generally disposed on a light receiving portion side of the solid-state imaging device such that incident light passes therethrough. Then, as shown in FIG. 7B, there is a space between the glass substrate 40 and an upper face of the solid-state imaging element. In this case, the incident light is reflected at three interfaces, that is, at an upper face of the glass substrate 40, a bottom face of the glass substrate 40, and the upper face of the solid-state imaging element. Usually, light of the order of 5% is reflected per one-time reflection. As a result, the quantity of light entering the light receiving portion 12 is reduced to the order of 80% of the initial incident light.

Alternatively, in the case where the adhesive material 41 is disposed between the glass substrate 40 and the upper face of the solid-state imaging element, two times of reflection, that is, reflection at the bottom face of the glass substrate 40 and reflection at the upper face of the solid-state imaging element can be greatly reduced.

However, it is more preferable that refractive indices of the glass substrate 40, the adhesive material 41, and the low refractive index transparent film 30 are substantially the same. In this case, the quantity of light entering the light receiving portion 12 can be of the order of 95% of the quantity of the initial incident light. The quantity of light entering the imaging area can be increased as compared to the case where the adhesive material 41 is not provided. Specifically, it is more preferable that the low refractive index transparent film 30 has a refractive index of greater than or equal to 1.4 and smaller than 1.5, and the refractive indices of the glass substrate 40 and the adhesive material 41 are greater than or equal to 1.4 and smaller than 1.5, which is substantially the same as the refractive index of the transparent film 30.

That is, in the present invention, as shown in FIG. 8A, if the upper face of the transparent film 30 is flat, the adhesive material 41 is provided on the transparent film 30, and the glass substrate 40 can be formed thereon. It is to be noted that the configuration shown in FIG. 8A has an advantage that it is possible to facilitate the material selection for the transparent film 30 and the adhesive material 41.

Moreover, if the transparent film 30 has a function as an adhesive material, the glass substrate 40 can be formed on the transparent film 30 as shown in FIG. 8B. It is to be noted that, the configuration of FIG. 8B has advantages such as that the amount of light reflected at interfaces of the transparent film 30 and the glass substrate 40 can be reduced, the quantity of light reaching the light receiving portion can be increased, and the number of fabrication steps can be reduced.

Figure 9:
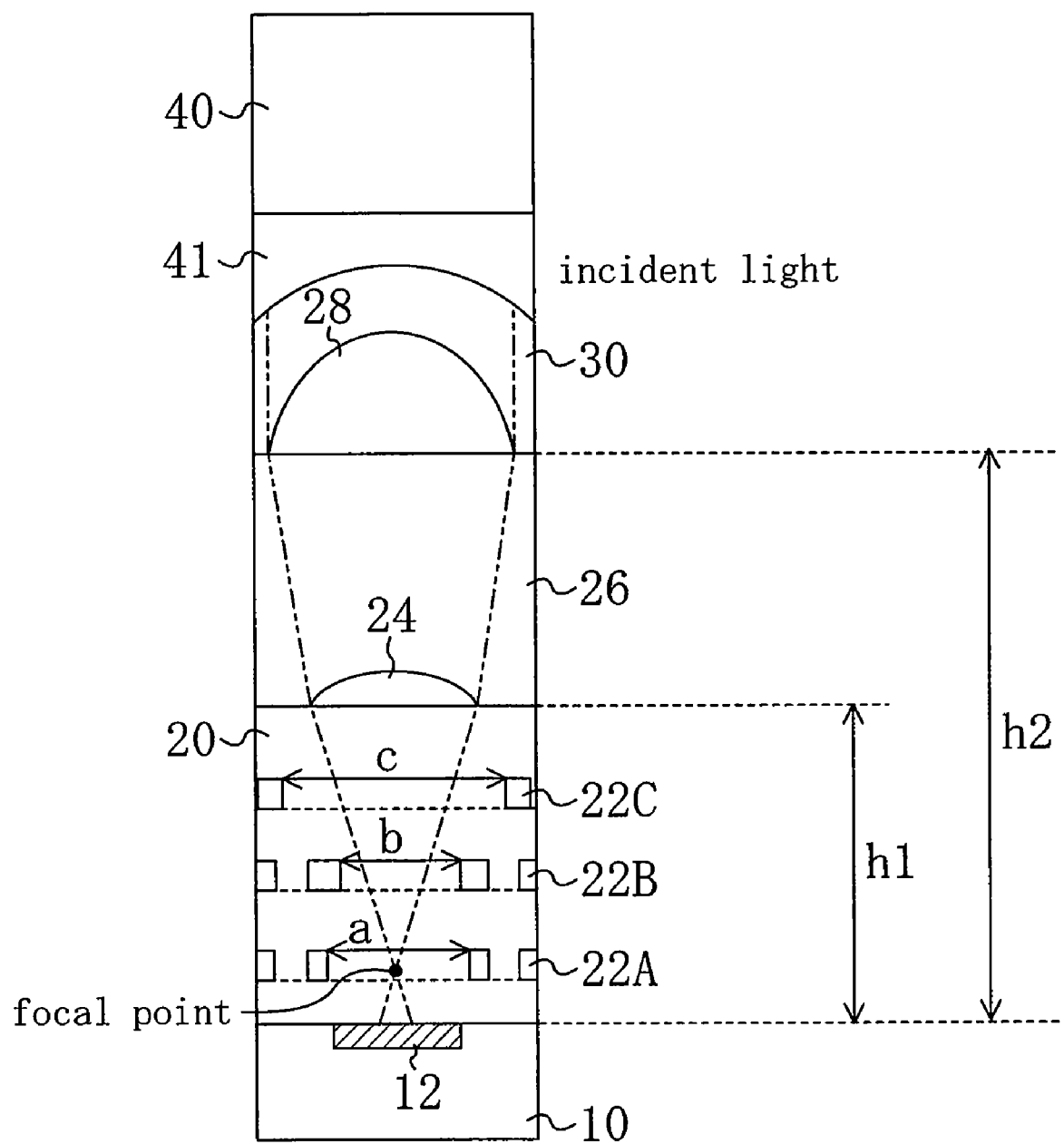
FIG. 9 is a cross-sectional view showing a variation of the MOS image sensor according to Embodiment 1.

Alternatively, in the MOS image sensor of the present invention, if the transparent film 30 has a curved upper face as shown in FIG. 9, an adhesive material 41 is formed on the transparent film 30 as in the MOS image sensor of FIG. 8A, and a glass substrate 40 can be formed thereon. It is to be noted that, the configuration shown in FIG. 9 has an advantage that it is possible to facilitate the material selection for the transparent film 30 and the adhesive material 41.

Variation of Embodiment 1

Next, with reference to FIGS. 10 and 11, detailed descriptions will be given of a solid-state imaging device (MOS image sensor) according to a variation of Embodiment 1.

Figure 10A:
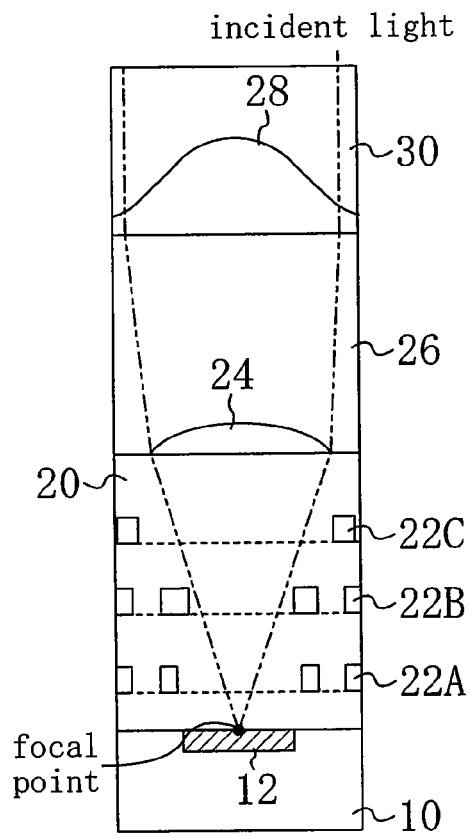
FIGS. 10A and 10B are views showing longitudinal sections respectively along the horizontal direction and the diagonal direction of part of a pixel of a MOS image sensor according to a variation of Embodiment 1.
Figure 10B:
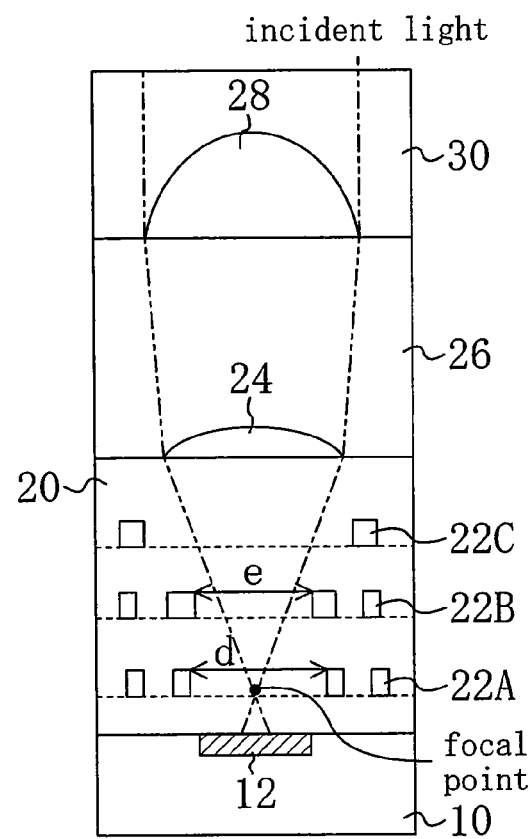
Figure 11A:
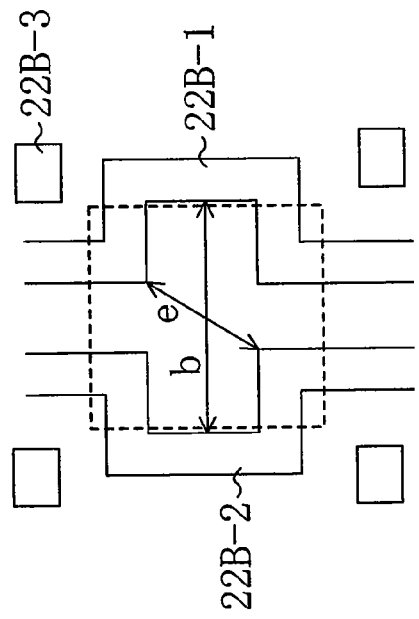
FIGS. 11A, 11B, and 11C are plan views respectively showing a first layer interconnect pattern, a second layer interconnect pattern, and a third layer interconnect pattern of the part of the pixel of the MOS image sensor according to the variation of Embodiment 1.
Figure 11B:
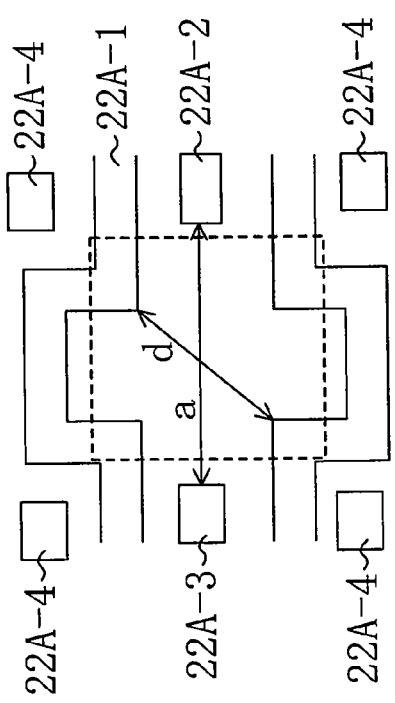
Figure 11C:
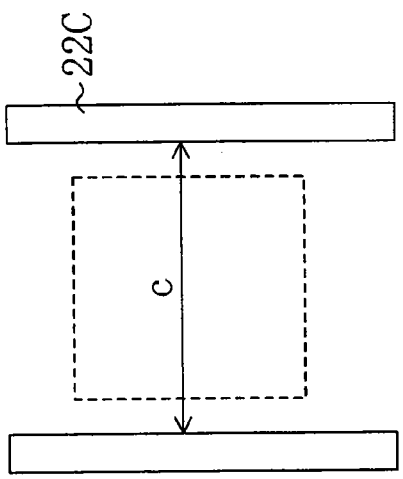

FIGS. 10A and 10B are views showing longitudinal sections respectively along the horizontal direction and the diagonal direction of part of a pixel of a MOS image sensor according to the variation of Embodiment 1. FIGS. 11A, 11B, and 11C are plan views respectively showing an interconnect pattern of the first layer, an interconnect pattern of the second layer, and an interconnect pattern of the third layer of part of the pixel of the MOS image sensor according to the variation of Embodiment 1. Here, as a rule, "diagonal direction" means, in the case where the imaging area is a quadrilateral in a plan view, a diagonal direction of the quadrilateral.

In the MOS image sensor of FIG. 1 according to Embodiment 1, in longitudinal sections taken along any direction, the focal position of the light collected by the top lens 28 and the inner-layer lens 24 is in one point above the substrate. In contrast, in the MOS image sensor according to the present variation, as to light entering in an optical axis direction of the top lens 28, as compared to a focal point of light passing through a horizontal direction section and a vertical direction section of the top lens 28, a focal point of light passing through a diagonal direction section of the top lens 28 is situated further above the upper face of the semiconductor substrate 10. In the examples of FIGS. 10A and 10B, a focal position of the light passing through the horizontal direction section of the top lens 28 is situated close to the upper face of the semiconductor substrate 10 (light receiving portion 12), and a focal position of the light passing through the diagonal direction section of the top lens 28 is situated above the light receiving portion and between the first interconnect layer and the second interconnect layer.

Moreover, in the longitudinal section along the horizontal direction, a top lens 28 is in contact or connection with an adjacent top lens 28, and in the longitudinal section along the diagonal direction, a top lens 28 is spaced apart from an adjacent top lens 28. It is to be noted that, in the case where a top lens 28 is disposed to be in contact or connection with an adjacent lens, the curvature of the lens in the relevant direction is smaller, as compared to the case where the top lens is not in contact or connection with an adjacent lens.

Moreover, as shown in FIG. 11A, above the light receiving portion 12, the opening width a of the interconnect 22A of the first layer in the horizontal direction is greater than the opening width d of the interconnect 22A of the first layer in the diagonal direction, and the opening width b of the interconnect 22B of the second layer in the horizontal direction is greater than the opening width e of the interconnect 22B of the second layer in the diagonal direction.

Therefore, in the MOS image sensor of the present embodiment, in the longitudinal section along the diagonal direction in which the opening width is smaller than in the other directions, a focal point of incident light is set to be situated between the first interconnect layer and the second interconnect layer. Therefore, it is possible to increase the light collection efficiency also in the direction in which the opening width of the interconnect is small. In contrast, the focal point of the incident light is situated closer to the upper face of the semiconductor substrate 10 in the longitudinal section along the horizontal direction than in the longitudinal section along the diagonal direction. In the longitudinal section along the horizontal direction, the divergence width of the incident light in the interconnect layer is great. However, since the interconnect width is great, the interconnect suppresses reflection and scattering of light, so that the light collection efficiency is not lowered.

It is to be noted that the examples of FIGS. 10 and 11 are not limitative. A focal point of incident light in the longitudinal section along the direction in which the opening width of the interconnect is small may be set in a position closer to the upper face of the semiconductor substrate 10 as compared to a focal point of incident light in the longitudinal section along the other directions. In this case, the same effect as that in the MOS image sensor of the present embodiment can be obtained.

Next, with reference to FIGS. 12 and 13, detailed descriptions will be given of the shape of the top lens of the MOS image sensor according to the present variation. FIG. 12A schematically shows top lenses in a plan view and cross-sectional views, wherein the top lenses are spaced apart from each other in any direction in the MOS image sensor. FIG. 12B schematically shows top lenses in a plan view and cross-sectional views, wherein the top lenses adjacent to each other at least in the horizontal direction are connected to each other.

Here, in the example of FIG. 12B, as to the top lens 28, a space g1 ($\leqq 0$) in the horizontal direction and a space g2 in the diagonal direction are respectively smaller than g1 ($>0$) and g2 of FIG. 12A. Each lens of FIG. 12A corresponds to the top lens 28 of Embodiment 1, and each lens of FIG. 12B corresponds to the top lens according to the variation of Embodiment 1.

Figure 13:
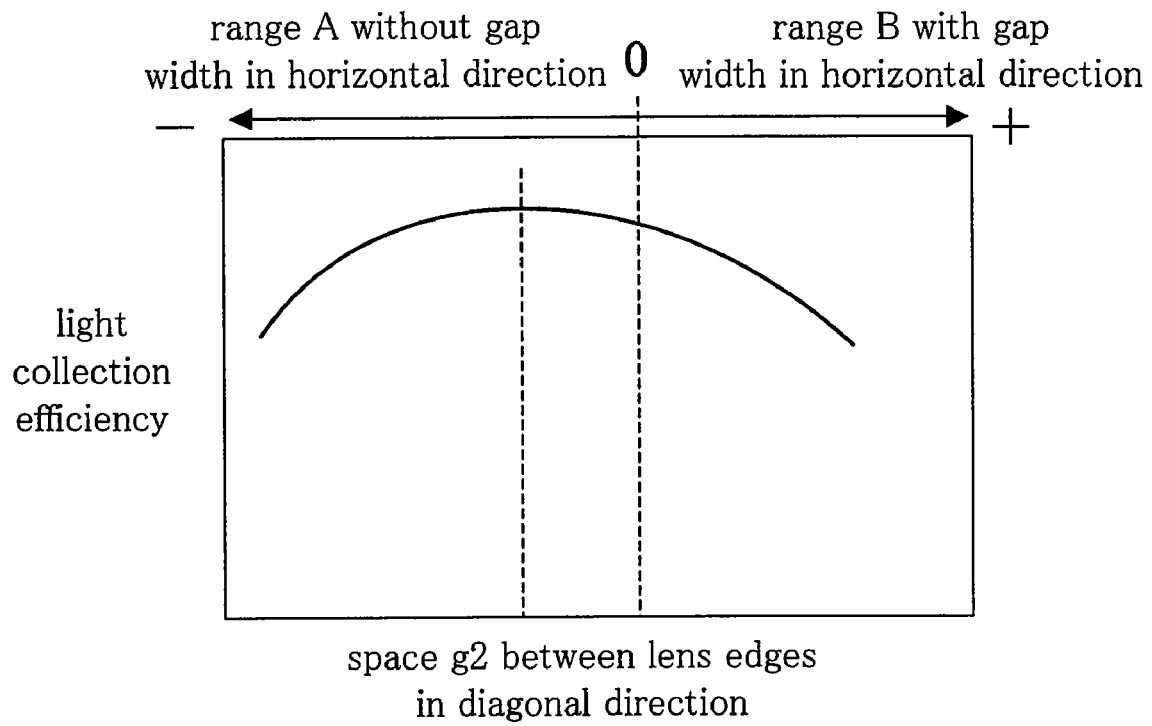
FIG. 13 is a view showing how the space between the top lenses relates to the light collection efficiency in a MOS image sensor.

FIG. 13 is a view showing the relation of the space between the top lenses to the light collection efficiency in the MOS image sensor. It is to be noted that the space g1 does not become negative actually, but to show the size of overlapping of the adjacent top lenses 28, also a range where g1<0 is shown in FIG. 13.

Usually, light entering the space between the top lenses 28 is not directed to the light receiving portion, but scattered by the interconnects or the like. Therefore, if the space between the top lenses 28 is reduced to direct incident light to the photodiode, the light collection efficiency can be improved. Meanwhile, if there is no space in the horizontal direction, the adjacent top lenses 28 are in connection with each other, the curvature is small at lens edges. In this case, as shown in FIG. 13, as the value of g1 lowers from 0 in the negative direction, the space g2 in the diagonal direction decreases, increasing the light collection efficiency. However, when g2 becomes lower than or equal to a certain value, the light collection efficiency lowers. Therefore, there is an optimum value for the space g2 in the diagonal direction of the top lens 28. As a result of the study by the inventors of the present application, it was found that in the case of 1.75 μm cell, the optimum value for the space width g2 in the diagonal direction was on the order of 0.5 μm.

In the solid-state imaging device of FIGS. 10 and 11 according to the variation of Embodiment 1, the top lenses 28 may be formed such that the space between quadrilateral photoresists in the horizontal direction (and in the vertical direction) is accordingly adjusted such that the top lenses 28 after heat flow can be in contact with each other in the horizontal direction.

In this way, in the MOS image sensor including the top lenses 28, in the diagonal direction section, a focal position of incident light collected by the top lens 28 and the inner-layer lens 24 is set between the first layer interconnect 22A and the second layer interconnect 22B, and in the horizontal direction section, the focal position is set closer to the upper face of the semiconductor substrate 10 as compared to the focal position in the diagonal direction section. In this way, the light collection efficiency can be increased to a maximum.

It is to be noted that in the MOS image sensor of the present variation, not only the top lenses 28 adjacent to each other in the horizontal direction but also the top lenses 28 adjacent to each other in the vertical direction may be in connection with each other. In this case, the upper face of the top lens 28 has the same curvatures in the vertical direction and in the horizontal direction. However, since in the pixel, the shapes of the interconnect structure and the light receiving portion (photodiode) are different in the vertical direction and the horizontal direction, the top lens 28 may be optimized to have different curvatures in the horizontal direction and the vertical direction.

For example, the curvature of the top lens 28 may be greater in a short side direction of the light receiving portion than in the long side direction of the light receiving portion to allow light to easily enter the light receiving portion.

It is to be noted that the focal point of the light passing through the horizontal direction section of the top lens 28 is preferably within a height range from the upper face of the semiconductor substrate 10 inclusive to the lowest interconnect layer (the lower surface of the interconnect 22A) exclusive.

Embodiment 2

Figure 14:
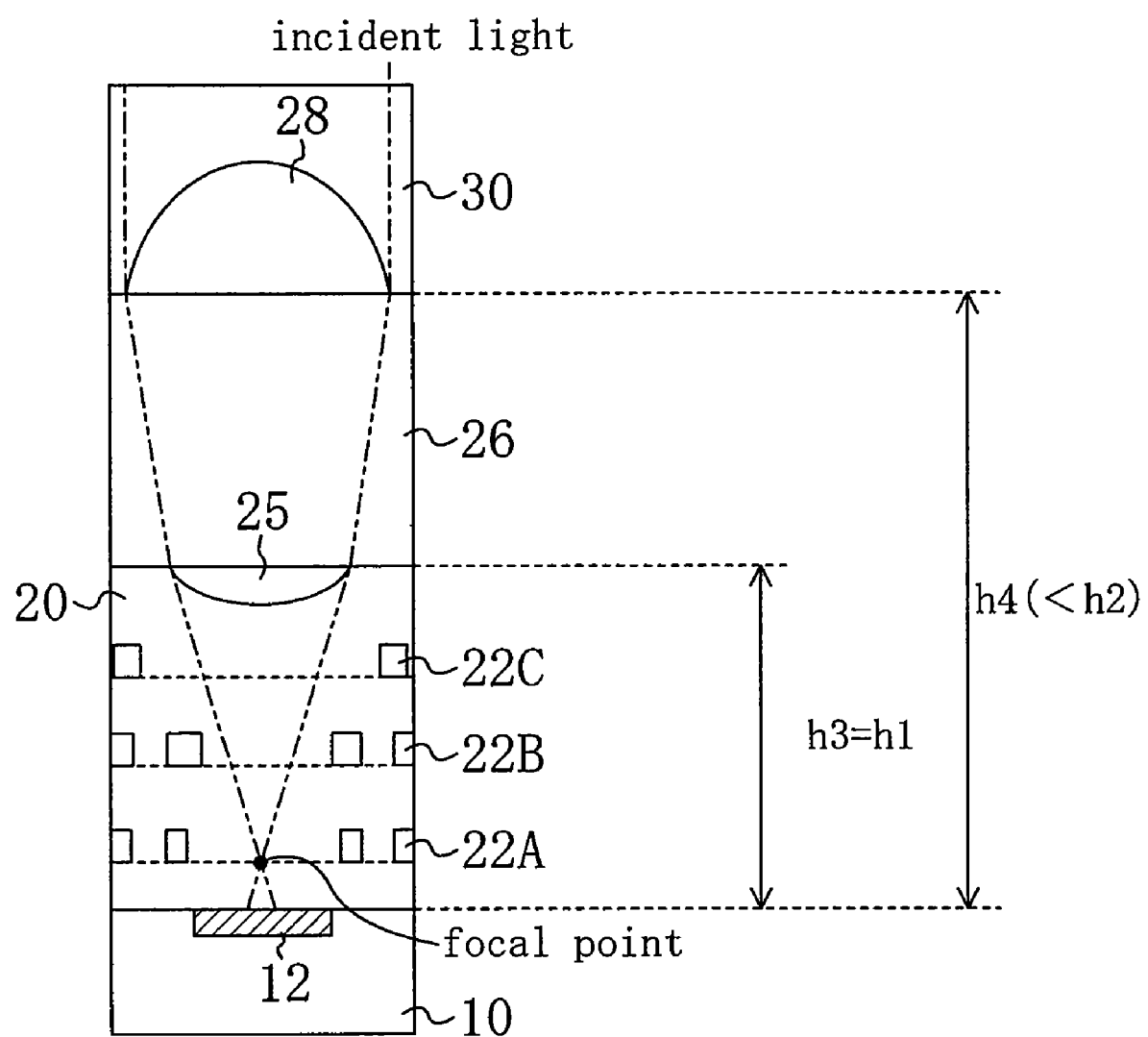
FIG. 14 is a cross-sectional view showing part of a pixel of a MOS image sensor according to Embodiment 2 of the present invention.

FIG. 14 is a cross-sectional view showing part of a pixel of a MOS image sensor according to Embodiment 2 of the present invention. In the figure, members which are the same as those in the MOS image sensor of FIG. 1 of Embodiment 1 are denoted by the same reference numbers as those in FIG. 1.

As shown in FIG. 14, the MOS image sensor of the present embodiment is different from the MOS image sensor of Embodiment 1 in that a lower face of an inner-layer lens 25 is downward convex (is concave).

In this case, a distance h3 between an upper face of the semiconductor substrate 10 and the inner-layer lens 25 is substantially the same as the distance h1 of the MOS image sensor of Embodiment 1. However, a distance h4 between the upper face of the semiconductor substrate 10 and the top lens 28 can be smaller than the distance h2 of the MOS image sensor of Embodiment 1.

The reason for this is that if an upper face of the inner-layer lens is convex, the inner-layer lens 24 is formed on the insulating film 20, but if a lower face of the inner-layer lens is downward convex, the inner-layer lens 25 can be formed in the insulating film 20. That is, in the MOS image sensor of the present embodiment, the inner-layer lens 25 is not formed in the insulating film 26, and thus the insulating film 26 can be thinned accordingly. For example, the distance h3 can be on the order of 3 μm and the distance h4 can be on the order of 4 μm. As described above, when the distance h2 between the upper face of the semiconductor substrate 10 and the top lens 28 is reduced, incident light is more easily collected to the light receiving portion 12 and the light collection efficiency can be improved as compared to the case where the upper face of the inner-layer lens is formed to be convex.

Also in this case, if the thickness (center thickness) of the inner-layer lens 25 is greater than the thickness of the top lens 28, it is possible to obtain the same light collection effect as that in the case where the upper face of the inner-layer lens 24 is convex.

Figure 15A:
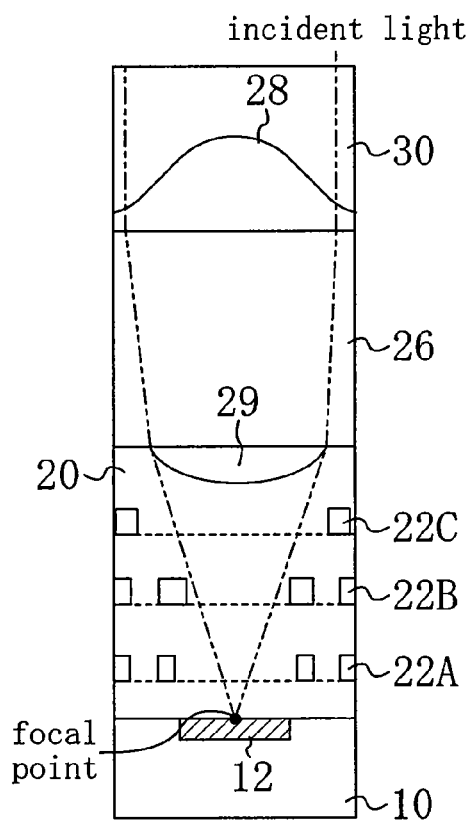
FIGS. 15A and 15B are views showing longitudinal sections respectively along the horizontal direction and the diagonal direction of the MOS image sensor according to Embodiment 2.
Figure 15B:
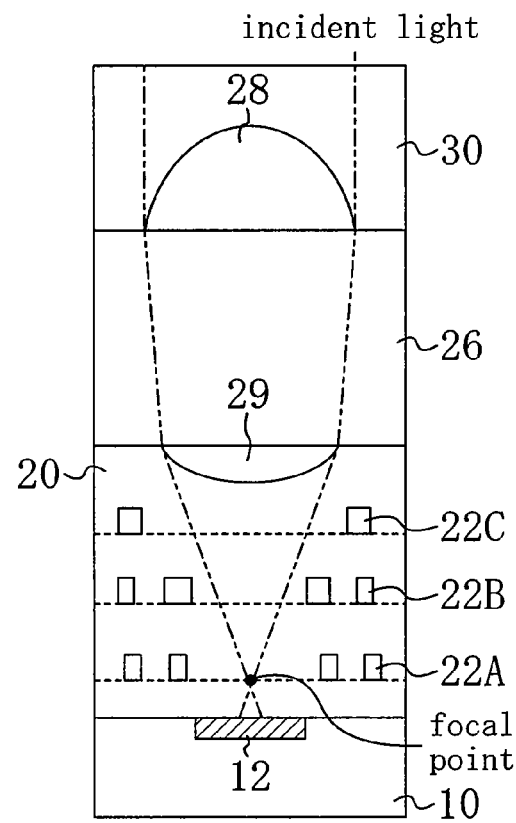
Figure 16:
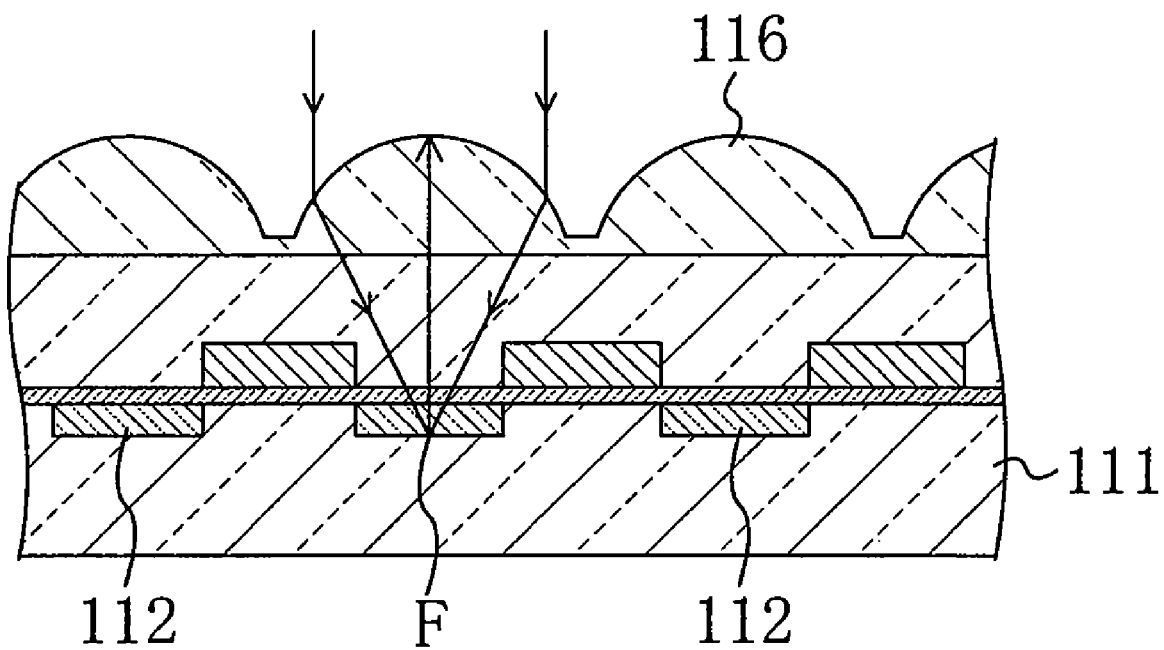
FIG. 16 is a cross-sectional view showing a conventional solid-state imaging device.

Moreover, as shown in FIGS. 15A and 15B, combining an inner-layer lens 29 having a downward convex lower face with a MOS image sensor including a top lens 28 connected to an adjacent lens in the horizontal direction makes it possible to more effectively collect light to the light receiving portion 12. Here, FIGS. 15A and 15B are views showing longitudinal sections respectively along the horizontal direction and the diagonal direction of the MOS image sensor of the present embodiment.

The above described solid-state imaging device of the present invention is applicable to a variety of image input devices such as a video camera, digital still camera, and facsimile.

What is claimed is:

1. A solid-state imaging device comprising:
   an imaging area including a plurality of light receiving portions formed on a semiconductor substrate;
   a multi-layered interconnect layer disposed on the plurality of light receiving portions, the multi-layered interconnect layer including metal interconnects and insulating films;
   first lenses formed on the multi-layered interconnect layer in one-to-one relationship with the light receiving portions;
   second lenses formed above the first lenses; and
   a transparent film formed on the second lenses, wherein
   a refractive index of the transparent film is smaller than a refractive index of the second lenses,
   a thickness of the second lenses is greater than a thickness of the first lenses,
   the plurality of light receiving portions, the first lenses, and the second lenses are disposed two-dimensionally in a vertical direction and a horizontal direction in the imaging area,
   the second lenses adjacent to each other in the horizontal direction are in connection with each other, and
   an upper face of each of the second lenses has a curvature smaller in the horizontal direction than in a diagonal direction.

2. The solid-state imaging device of claim 1, wherein an upper face of the transparent film is flat.

3. The solid-state imaging device of claim 1, wherein an upper face of the transparent film is curved.

4. The solid-state imaging device of claim 1, further comprising:
   an adhesive material disposed on the transparent film; and
   a transparent component formed on the adhesive material.

5. The solid-state imaging device of claim 1, further comprising a transparent component formed on the transparent film.

6. The solid-state imaging device of claim 1, wherein at least one of the metal interconnects, the first lenses, and the second lenses in the periphery of the imaging area are shifted, on a basis of positions of the light receiving portions, toward or apart from the center of the imaging area.

7. The solid-state imaging device of claim 1, wherein an upper face of each of the first lenses is convexly curved face.

8. The solid-state imaging device of claim 1, wherein a lower face of each of the first lenses is downward convexly curved face.

9. The solid-state imaging device of claim 1, wherein the first lenses are formed of an inorganic material.

10. The solid-state imaging device of claim 1, wherein the second lenses are formed of an organic material.

* * * * *